(12) United States Patent
Speichermann

(10) Patent No.: US 11,217,834 B2
(45) Date of Patent: Jan. 4, 2022

(54) ENERGY STORAGE UNIT FOR A MOTOR VEHICLE BATTERY, AND METHOD FOR FITTING AN ENERGY STORAGE UNIT

(71) Applicant: Dr. Ing. h.c. F. Porsche Aktiengesellschaft, Stuttgart (DE)

(72) Inventor: Justus Speichermann, Stuttgart (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 588 days.

(21) Appl. No.: 15/597,335

(22) Filed: May 17, 2017

(65) Prior Publication Data
US 2017/0338529 A1 Nov. 23, 2017

(30) Foreign Application Priority Data

May 20, 2016 (DE) .......................... 102016109283.5

(51) Int. Cl.
| | |
|---|---|
| *H01M 10/48* | (2006.01) |
| *G01R 31/36* | (2020.01) |
| *H01M 50/20* | (2021.01) |
| *G01R 31/385* | (2019.01) |

(52) U.S. Cl.
CPC ...... *H01M 10/488* (2013.01); *G01R 31/3646* (2019.01); *H01M 10/48* (2013.01); *H01M 50/20* (2021.01); *G01R 31/3865* (2019.01); *H01M 2220/20* (2013.01)

(58) Field of Classification Search
None
See application file for complete search history.

(56) References Cited

U.S. PATENT DOCUMENTS

| | | |
|---|---|---|
| 5,760,588 A | 6/1998 | Bailey |
| 8,269,463 B2 | 9/2012 | Nakashima et al. |
| 8,836,285 B2 | 9/2014 | Yamada et al. |
| (Continued) | | |

FOREIGN PATENT DOCUMENTS

| | | |
|---|---|---|
| DE | 102012218494 A1 | 4/2014 |
| JP | S6366865 A | 3/1988 |
| (Continued) | | |

OTHER PUBLICATIONS

Machine English Translation of DE 10 2012 218 494 to Bosch, 2014, (Year: 2014).*

(Continued)

*Primary Examiner* — Douglas X Rodriguez
(74) *Attorney, Agent, or Firm* — RatnerPrestia

(57) ABSTRACT

An energy storage unit for a motor vehicle battery is provided, having an energy store, particularly configured as a battery cell module, for storing and delivering electric power. A measuring device measures electrical properties of the energy store. An evaluation unit, connected to the measuring device, ascertains the operational status of the energy store from the measurement results of the measuring device. An indicator unit is connected to the evaluation unit for depicting the operational status of the energy store. By ascertaining and depicting the operational status and not just the state of charge of the energy store, it is possible to dispense with separate complex measurements when fitting the energy store, so that an energy storage unit can be checked quickly and efficiently when fitted into a motor vehicle.

7 Claims, 1 Drawing Sheet

(56) References Cited

U.S. PATENT DOCUMENTS

| | | | |
|---|---|---|---|
| 9,031,801 B2 | 5/2015 | Sugaya et al. | |
| 9,203,248 B2 | 12/2015 | Ohkawa et al. | |
| 2001/0033169 A1 | 10/2001 | Singh et al. | |
| 2007/0001680 A1 | 1/2007 | Khoo | |
| 2012/0175953 A1 | 7/2012 | Ohkawa et al. | |
| 2014/0077593 A1* | 3/2014 | Schaefer | H01M 10/482 307/18 |
| 2014/0085094 A1* | 3/2014 | Schumann | G08B 21/182 340/636.1 |

FOREIGN PATENT DOCUMENTS

| | | |
|---|---|---|
| JP | H04292871 A | 10/1992 |
| JP | 05107325 A | 4/1993 |
| JP | 2000277061 A | 10/2000 |
| JP | 2001511527 A | 8/2001 |
| JP | 2007285714 A | 11/2007 |
| JP | 2008017593 A | 1/2008 |
| JP | 2012114999 A | 6/2012 |
| JP | 2014197542 A | 10/2014 |
| JP | 2015144563 A | 8/2015 |
| WO | 2010035567 A1 | 4/2010 |
| WO | 2010109784 A1 | 9/2010 |
| WO | 2011037257 A1 | 3/2011 |
| WO | 2012132769 A1 | 10/2012 |
| WO | 2014179313 A1 | 11/2014 |
| WO | 2016035159 A1 | 3/2016 |

OTHER PUBLICATIONS

Notification of Reason for Rejection for Japanese Application No. 2017-099513, dated Jul. 31, 2018, 9 pages.

Chinese Office Action for Chinese Application No. 201710348845.3, dated Jan. 31, 2019, with translation, 13 pages.

Japanese Notification of Reason for Rejection for Japanese Application No. 2017-099513, dated Mar. 26, 2019, 4 pages.

German Search Report for German Application No. 10 2016 109 283.5, dated Jan. 13, 2017, including partial English translation, 8 pages.

Japanese Notification of Reason for Rejection for Japanese Application No. 2017-099513, dated Oct. 29, 2019, 10 pages.

Japanese Decision of Refusal for Japanese Application No. 2017-099513, dated Feb. 18, 2020, 4 pages.

\* cited by examiner

ENERGY STORAGE UNIT FOR A MOTOR VEHICLE BATTERY, AND METHOD FOR FITTING AN ENERGY STORAGE UNIT

CROSS-REFERENCE TO RELATED APPLICATIONS

This application claims priority to German Patent Application No. 102016109283.5, filed May 20, 2016, the content of such application being incorporated by reference herein in its entirety.

FIELD OF THE INVENTION

The invention relates to an energy storage unit for a motor vehicle and to a method for fitting an energy storage unit that can be used to store and deliver electric power for a motor vehicle battery.

BACKGROUND OF THE INVENTION

DE 10 2012 218 494 A1, which is incorporated by reference herein, discloses a status indicator for a motor vehicle battery that can depict the present state of charge of the motor vehicle battery using LED lamps that change color.

There is a constant need, when an energy storage unit is fitted into a motor vehicle, to be able to check the proper state of the energy storage unit quickly and efficiently.

SUMMARY OF THE INVENTION

According to aspects of the invention, an energy storage unit for a motor vehicle is provided, having an energy store, particularly configured as a battery cell module, for storing and delivering electric power, a measuring device for measuring electrical properties of the energy store, an evaluation unit, connected to the measuring device, for ascertaining the operational status of the energy store from the measurement results of the measuring device, and an indicator unit, connected to the evaluation unit, for depicting the operational status of the energy store.

In this context, it is taken into consideration that the monitoring of a state of charge of the energy store may not be sufficient for monitoring an operational status of the energy store ("state of health").

By way of example, discovery of an 80% charged energy store may suggest sufficient operational status that, if the ageing state of the energy store means that further charging beyond this level is no longer possible, does not actually meet the desired quality requirements on the operational status of the energy store. The measuring device can be used in particular to measure multiple electrical properties of the energy store that, in total, allow a better appraisal of the operational status of the energy store than just the state of charge. By way of example, the measuring device and the evaluation unit can be used to ascertain a self-discharge rate of the energy store, which can be a measure of the ageing state of the energy store. The indicator unit can be used to depict the operational status of the energy store in a manner clearly discernible to a fitter, so that it is not necessary, during fitting, first to ascertain the electrical properties of the energy store and to establish the operational status of the energy store in order to be convinced of the proper electrical state of the energy store. As a result, fitting can be accomplished with distinctly lower complexity and hence less expensively.

In this context, it can be taken into consideration that particularly if a service or a repair is intended to involve an energy store being replaced, the new energy store may already have been in storage for a relatively long time and might already have aged too greatly in this storage time. Fitting an energy store that has dropped below a desired quality level as a result of ageing can be avoided thereby. By ascertaining and depicting the operational status and not just the state of charge of the energy store, it is possible to dispense with separate complex measurements when fitting the energy store, so that an energy storage unit can be checked quickly and efficiently when fitted in a motor vehicle.

The energy storage unit can have particularly a battery management system and/or battery cell module electronics, in which the measuring device and/or the evaluation unit may be integrated. By way of example, the battery cell module electronics may already have measuring units that can be used by the measuring device, while the evaluation unit, as part of the battery management system, can process the measurement data relevant to ascertaining the operational status of the energy store. The indicator unit is particularly connected to the energy store and preferably positioned at a location that is easily visible from the outside.

The measuring device and/or the evaluation unit may particularly be provided inside the energy store. By way of example, the measuring device can measure the current and/or the voltage and/or the temperature and/or the state of charge of the energy store. The evaluation unit can process the measurement data of the measuring device and, by way of example, compare them with a family of data characteristics in order to infer the operational status of the energy store. A lack of operational status of the energy store can be established particularly when the energy store has aged too greatly. Alternatively, it is possible for a lack of operational status of the energy store to be established when a measured value is outside a prescribed target window and/or implausible measurement data are ascertained that might indicate a defect in the energy store and/or in the measurement technique used. By way of example, the indicator unit can allow a depiction that corresponds to a lack of operational status of the energy store ("not OK"), and can allow a further depiction, easily distinguishable therefrom, that corresponds to the status of the energy store being operational ("OK"). Preferably, the indicator unit can allow at least one further depiction that corresponds to an intermediate state between "OK" and "not OK", for example when the life is merely restricted but still sufficient and/or a service or a replacement is merely advisable but not absolutely necessary.

In particular, the evaluation unit has a memory unit for storing the measurement results of the measuring device at different measurement times, the evaluation unit being configured to determine the operational status of the energy store from the measurement results of the measuring device at different measurement times. The memory unit can be used to take into consideration not only present measured values but also past measured values. This particularly allows a self-discharge rate of the energy store and the time profile of the self-discharge rate to be recorded and evaluated. The time profile of the measurement data measured by the measuring device and/or of characteristic values ascertained therefrom can particularly infer an ageing state of the energy store. Preferably, the measuring device and/or the evaluation unit has a chronometer, so that it is also possible to take into consideration the absolute time and/or a relative time since completion of the manufacture of the energy storage module, for example, in order to determine the operational status of the energy store.

Preferably, the evaluation unit is configured to ascertain from the measurement results of the measuring device an ageing state of the energy store and/or a self-discharge rate of the energy store and/or a failure of a measuring unit of the measuring device and/or an arrival at a critical and/or overcritical state of charge of the energy store. These evaluation results can each, independently or in combination with the further evaluation results, signify a lack of operational status of the energy store that needs to be depicted in an appropriate manner by the indicator unit.

As a particular preference, the display unit is configured to visually depict the operational status. Haptic or acoustic forms of depiction can be avoided thereby. The indicator unit can, by way of example depict a symbol and/or a legend that indicates the operational status of the energy store.

In particular, the display unit has piezoelectric crystals and/or liquid crystals. The piezoelectric crystals and/or liquid crystals and/or comparable indicator elements can be manipulated by an electric current and/or a voltage in order to change their appearance. The change of appearance allows a change on the indicator unit from "OK" to "not OK" to be visually depicted. In this context, use is made of the insight that the energy store itself can provide electric power in order to drive the indicator unit and to make the change on the indicator unit from "OK" to "not OK".

Preferably, the display unit has an electrically or electronically actuatable color zone. By way of example, the color zone can change from green for "OK", if need be via an intermediate position, to red for "not OK". This results in an intuitive perception of whether or not the energy store is operational. The color zone of the indicator unit can be actuated by the evaluation unit, particularly by using the electric power provided by the energy store.

As a particular preference, the display unit has a color zone that can have its color changed irreversibly, particularly a change of color for the color zone back to an original state being blocked by the evaluation unit. The irreversible change of color for the color zone allows a lack of operational status of the energy store, once established, to be recorded and not overwritten by later measurements that establish sufficient operational status. By way of example, the energy storage unit may contain a loose connection from an electrical component, which means that at least intermittent failure of the energy store can be expected at any time. Once the evaluation unit has established failure of the energy store in this case, this energy storage unit remains marked as not operational, even if the failure cannot be reproduced by the measurements of the measuring device at a later time. The risk of fitting an energy storage unit that is not working properly is reduced thereby.

In particular, the display unit, particularly the color zone, is connected to the energy store so as to be detachable, particularly able to be scraped off. Detachment of or deliberate damage to the indicator unit allows an energy store to be permanently marked as not operational. This allows a depiction of the indicator unit in a manner envisaged for "OK" to be rendered impossible. Preferably, the evaluation unit identifies the detachment of or deliberate damage to the indicator unit, for example in order to put an appropriate entry into an internal error memory. This can increase protection against forgery should energy storage units that are no longer operational be provided with a forged indicator unit that has a color zone constantly pointing to "OK".

Also described is a method for fitting an energy storage unit into a motor vehicle, in which an energy storage unit that can be produced and developed as described above is provided, the operational status of the energy store is checked using the display unit and, if the display unit depicts the status of the energy store as being operational, then the energy storage unit is subsequently fitted in the motor vehicle, particularly as part of the motor vehicle battery. If the indicator unit depicts insufficient operational status, then the relevant energy storage unit can be eliminated. By ascertaining and depicting the operational status and not just the state of the charge of the energy store, it is possible to dispense with separate complex measurements when fitting the energy store, so that an energy storage unit can be checked quickly and efficiently when fitted into a motor vehicle.

In particular, the display unit is at least partially removed after the energy storage unit is checked, particularly after the energy storage unit is fitted. This allows the energy storage unit to be marked as already used, which allows insufficient operational status to be attested for the energy store if it is taken out later and reused in another motor vehicle. As a result, it is possible to prevent, by way of example, an energy store with a missing guarantee from being fitted, the state of which energy store might have been impaired by a previous owner. Particularly when the indicator unit is removed after fitting, a battery management system can identify that the energy storage unit was previously intact, which means that the energy store is not managed as defective internally. This allows the energy store to be automatically managed as "not OK" only after the energy store is taken out.

BRIEF DESCRIPTION OF THE DRAWINGS

The invention is explained by way of example below with reference to the appended drawings on the basis of preferred exemplary embodiments, the features depicted below each being to depict an aspect of the invention either individually or in combination. In the drawings.

DETAILED DESCRIPTION OF THE INVENTION

Figure 1:
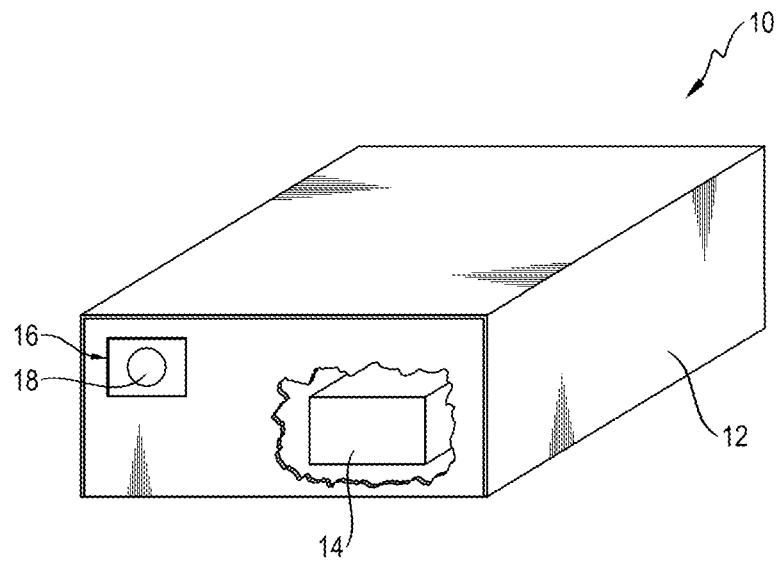
FIG. 1 shows a schematic perspective depiction of an energy storage unit.

The energy storage unit 10 depicted in FIG. 1 has a housing 12 in which an energy store is provided. The energy store may be a battery cell, particularly a pouch cell, for example. It is also possible for the energy store to be a battery cell module having a plurality of battery cells that is able to be interconnected with other battery cell modules to form a motor vehicle battery. Further, the energy store may be a motor vehicle battery, particularly a traction battery for electrically driving a motor vehicle, having a plurality of battery cell modules. The energy storage unit 10 has a battery management system 14, particularly inside the housing 12. The battery management system 14 can have an evaluation unit that is connected to a measuring device and that can infer the operational status of the energy store from the measured values of electrical state variables of the energy store that are measured by the measuring device. In particular, it is possible for an ageing state of the energy store to be ascertained in order to establish the operational status of the energy store. The evaluation unit is connected to an indicator unit 16 that has a color zone 18. The color zone 18 can change its color irreversibly.

Figure 2:
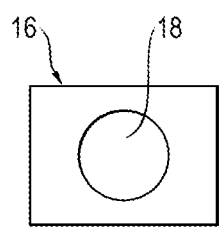
FIG. 2 shows a schematic plan view of an indicator unit of the energy storage unit from FIG. 1 in a first depiction state.
Figure 3:
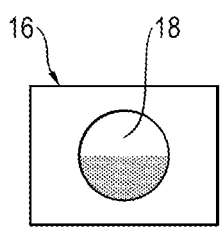
FIG. 3 shows a schematic plan view of the indicator unit from FIG. 2 in a second depiction state.
Figure 4:
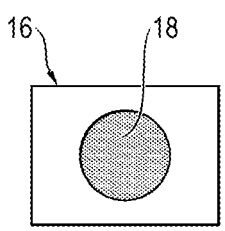
FIG. 4 shows a schematic plan view of the indicator unit from FIG. 2 in a third depiction state.

When the status of the energy store is operational, the color zone 18 of the indicator unit 16 can have a coloration that corresponds to an "OK" state, as depicted in FIG. 2. By way of example, the color zone 18 is completely green in color. Preferably, there is provision for a half-life or a need for a service for the energy store to be indicated by virtue of the color zone 18 having its color partially changed, for example, as depicted in FIG. 3. To this end, part of the color zone, for example the lower half, can be colored in a different color, particularly red. To this end, piezoelectric crystals and/or liquid crystals can have their color changed, for example, by virtue of electrical actuation and/or at least partial discontinuation of the electrical actuation. If the energy store is not operational, then the color zone 18 of the indicator unit 16 can have its color changed completely to a coloration that corresponds to a "not OK" state, as depicted in FIG. 4. To this end, the color zone 18 may be complete red in color, for example.

What is claimed is:

1. An energy storage unit for a motor vehicle, comprising
an energy store configured as a battery cell module for storing and delivering electric power,
a measuring device for measuring electrical properties of the energy store,
an evaluation unit, connected to the measuring device, for ascertaining an operational status of the energy store from the measurement results of the measuring device, and
an indicator unit, connected to the evaluation unit, for visually depicting the operational status of the energy store, the indicator unit having a color zone that irreversibly changes color when the evaluation unit ascertains a lack of operational status of the energy store, the indicator unit configured to irreversibly change color in response to at least partial discontinuation of electrical actuation of the indicator unit.

2. The energy storage unit as claimed in claim 1, wherein the evaluation unit has a memory unit for storing the measurement results of the measuring device at different measurement times, the evaluation unit being configured to determine the operational status of the energy store from the measurement results of the measuring device at different measurement times.

3. The energy storage unit as claimed in claim 1, wherein the operational status ascertained from the measurement results of the measuring device comprises an ageing state of the energy store, a self-discharge rate of the energy store, or an arrival at a critical or overcritical state of charge of the energy store.

4. The energy storage unit as claimed in claim 1, wherein the indicator unit has piezoelectric crystals or liquid crystals.

5. The energy storage unit as claimed in claim 1, wherein the indicator unit has an electrically or electronically actuatable color zone.

6. The energy storage unit as claimed in claim 1, wherein the evaluation unit is configured to block a change of color for the color zone back to an original state.

7. The energy storage unit as claimed in claim 1, wherein the indicator unit is detachably connected to the energy store.

* * * * *